(12) United States Patent
Osato

(10) Patent No.: US 7,946,855 B2
(45) Date of Patent: May 24, 2011

(54) CONTACT AND ELECTRICAL CONNECTING APPARATUS

(75) Inventor: Eichi Osato, Tokyo (JP)

(73) Assignee: Kabushiki Kaisha Nihon Micronics (JP)

( * ) Notice: Subject to any disclaimer, the term of this patent is extended or adjusted under 35 U.S.C. 154(b) by 89 days.

(21) Appl. No.: 12/608,533

(22) Filed: Oct. 29, 2009

(65) Prior Publication Data

US 2010/0120299 A1 May 13, 2010

(30) Foreign Application Priority Data

Nov. 7, 2008 (JP) ................................. 2008-286981
Sep. 18, 2009 (JP) ................................. 2009-217722

(51) Int. Cl.
*H01R 13/24* (2006.01)
(52) U.S. Cl. ..................................... 439/66; 324/755.05
(58) Field of Classification Search .................... 439/66, 439/700, 824; 324/755.05
See application file for complete search history.

(56) References Cited

U.S. PATENT DOCUMENTS

| 6,396,293 | B1 * | 5/2002 | Vinther et al. ........... 324/755.05 |
| 6,506,082 | B1 * | 1/2003 | Meek et al. .................... 439/700 |
| 6,821,131 | B2 | 11/2004 | Suzuki et al. ................... 439/73 |
| 7,025,602 | B1 | 4/2006 | Hwang ............................ 439/66 |
| 7,256,593 | B2 * | 8/2007 | Treibergs ................. 324/754.05 |
| 7,559,769 | B2 * | 7/2009 | Hsiao et al. ..................... 439/66 |
| 7,559,806 | B2 * | 7/2009 | Lin et al. ....................... 439/700 |
| 7,772,865 | B2 * | 8/2010 | Tan .......................... 324/762.02 |

FOREIGN PATENT DOCUMENTS

JP        11-317270        11/1999

* cited by examiner

*Primary Examiner* — Neil Abrams
(74) *Attorney, Agent, or Firm* — Bacon & Thomas, PLLC

(57) ABSTRACT

A contact type electrical connector includes a first plunger in contact with one member; a second plunger in contact with another member and electrically connected to the first plunger, whereby the two members are electrically connected through the first plunger; a cylindrical support member for slidably and elastically supporting the first and second plungers with a connection portion of the first plunger and a connection portion of the second plunger overlapping and electrically connected; and a compression coil spring surrounding the outer peripheries of the first and second plungers with the connection portions thereof supported by the cylindrical support member and brought into contact with a spring receiving portion of each of the plungers so as to urge the plungers apart. The cylindrical support member, which may be formed as a coil spring, serves to improve electrical connection between the plungers.

8 Claims, 18 Drawing Sheets

CONTACT AND ELECTRICAL CONNECTING APPARATUS

CROSS-REFERENCE TO RELATED APPLICATION

This application claims, under 35 USC 119, priority of Japanese Application No. 2009-217722 filed Sep. 18, 2009 and Japanese Application No. 2008-286981 filed Nov. 7, 2008.

BACKGROUND OF THE INVENTION

1. Field of the Invention

The present invention relates to a contact to be touched by an electrode provided in a wiring substrate, a semiconductor integrated circuit and the like and an electrical connecting apparatus.

2. Description of Related Art

A contact for electrically connecting electric circuits and the like of opposedly disposed wiring substrates to each other is known in general. Examples of such a contact include those described in U.S. Pat. No. 7,025,602 (Patent Document 1) and Japanese Patent Laid-Open No. 2004-152495 (Patent Document 2), for example.

A contact 1 in Patent Document 1 is, as shown in FIGS. 2 and 3, constituted by two contact pins 2 with the same shape and a coil spring 3.

The contact pin 2 is mainly constituted by a locking claw 4, a locking hole 5, a flange portion 6, and a pin distal end portion 2A. The two locking claws 4 are provided to oppose each other and are supported by flexible supporting rod portions 4A. As a result, the two locking claws 4 are brought close to and separated from each other. The locking hole 5 is a hole in which the locking claws 4 are fitted and is formed in a rectangular shape according to a width of the locking claw 4. As a result, by fitting the two contact pins 2 opposing each other with displacement by 90 degrees, the two locking claws 4 are locked by openings of the locking hole 5, respectively, and they will not drop off. The flange portion 6 is a portion to which the coil spring 3 is brought into contact. By fitting the two contact pins 2 with each other with displacement by 90 degrees in a state inserted into the coil spring 3, respectively, both ends of the coil spring 3 are brought into contact with each flange portion 6, and the contact 1 is assembled. Both end portions of the contact 1 assembled in a state where the two contact pins 2 are fitted with each other are made into the pin distal end portions 2A to be touched by an electrode or the like and electrically connected.

A contact 7 in Patent Document 2 is, as shown in FIG. 4, constituted by a plunger 8 and a spring 9.

The plunger 8 is formed in an elongate plate shape, a wide portion 8A receiving the spring 9 is provided at an upper part thereof, and a terminal portion 8B to be touched by an electrode is formed at an upper part of the wide portion 8A. At a lower part of the wide portion 8A, a core rod portion 8C to be inserted into the spring 9 capable of vertical movement is formed. The spring 9 is formed with an inner diameter such that the core rod portion 8C can be inserted capable of vertical movement. A lower end portion of the spring 9 is converged so as to be touched by an electrode or the like.

There is also a structure as in Japanese Patent Laid-Open No. 11-317270 (Patent Document 3). A socket for an electric component in Patent Document 3 has a contact member to be in contact with a terminal of an electric component, a substrate conductive member formed by a plate material having conductivity and to be connected to a print circuit substrate, and a coil spring disposed between the contact member and the substrate conductive member and having the both conducted. The contact member and the substrate conductive member are not in contact with each other but connected by the coil spring.

SUMMARY OF THE INVENTION

However, with the contact 1 in the above Patent Document 1, if the locking claws 4 repeatedly touch a peripheral edge of the locking hole 5 with expansion and contraction of the contact 1 in a state in which the locking claws 4 of one of the contact pins 2 are fitted in the locking hole 5 of the other contact pin 2, the locking claws 4 or the supporting rod portions 4A might be damaged by abrasion or the like, and durability is not enough.

Also, since with regard to each of the contact pins 2, only the locking claws 4 are fitted in the locking hole 5 on the opposite side and their contact area is small, electrical connection is mainly performed by the coil spring 3. However, since the portions of the locking claw 4 and the supporting rod portion 4A need to be expanded and fitted in the locking hole 5 on the opposite side in a state inserted into the coil spring 3, it is difficult to have an inner diameter such that the coil spring 3 tightens the contact pin 2. Moreover, since the coil spring 3 is a compression spring and has fewer contact points with the contact pin 2, close contact between each of the contact pins 2 and the coil spring 3 is weak. Therefore, a contact portion between the flange portion 6 of each of the contact pins 2 and the coil spring 3 becomes a major passage through which electricity flows, but a small contact area easily causes abrasion, corrosion and the like, and electrical contact is poor. Therefore, there are problems that contact failure can easily occur and durability is not enough.

Also, with the contact 7 in Patent Document 2, since the inner diameter of the spring 9 is set at a dimension through which the core rod portion 8C of the plunger 8 can be inserted capable of vertical movement, the plunger 8 and the spring 9 might or might not touch each other, which is poor in electrical contact. Therefore, the plunger 8 and the spring 9 are mainly electrically connected at a contact between the wide portion 8A of the plunger 8 and the upper end portion of the spring 9. Therefore, there are problems that a small contact area can easily cause contact failure due to abrasion, corrosion and the like, electrical contact is poor, and durability is not enough.

Also, in Patent Document 3, since the plungers do not touch each other but are only electrically connected by a spring, there is a problem that electrical contact is poor.

The present invention was made in view of the above problems and has an object to provide a contact which solves contact failure and improves durability and an electrical connecting apparatus using the contact.

A contact according to the present invention was made in order to solve the above problems and is constituted by a first plunger in contact with one of members, a second plunger for having the one member and the other member electrically conducted in collaboration with the first plunger by touching the other member in a state electrically connected to the first plunger, a cylindrical support member for slidably and elastically supporting a connection portion of the first plunger and a connection portion of the second plunger in an overlapped and electrically connected state, and a compression coil spring covering outer peripheries of the first plunger and the second plunger in a state in which each of the connection portions thereof is supported by the cylindrical support member and brought into contact with spring receiving portions of the plungers so as to urge the plungers in a direction to be separated from each other.

In an electrical connecting apparatus for conducting a test in contact with an electrode of a specimen, a contact disposed at a position corresponding to each electrode of the specimen and brought into contact with each of the electrodes for conduction is provided, and the above-mentioned contact is used as the contact.

Advantageous Effects Of Invention

In a contact and an electrical connecting apparatus according to the present invention, since it is so constructed that the connection portion of the first plunger and the connection portion of the second plunger are supported slidably and elastically by the cylindrical support member in a state overlapped with each other and electrically connected, electric contact between the plungers is improved and durability is improved with use of the contact.

DESCRIPTION OF THE PREFERRED EMBODIMENTS

A contact and an electrical connecting apparatus according to embodiments of the present invention will be described below referring to the attached drawings.

(A) First Embodiment

Figure 1:
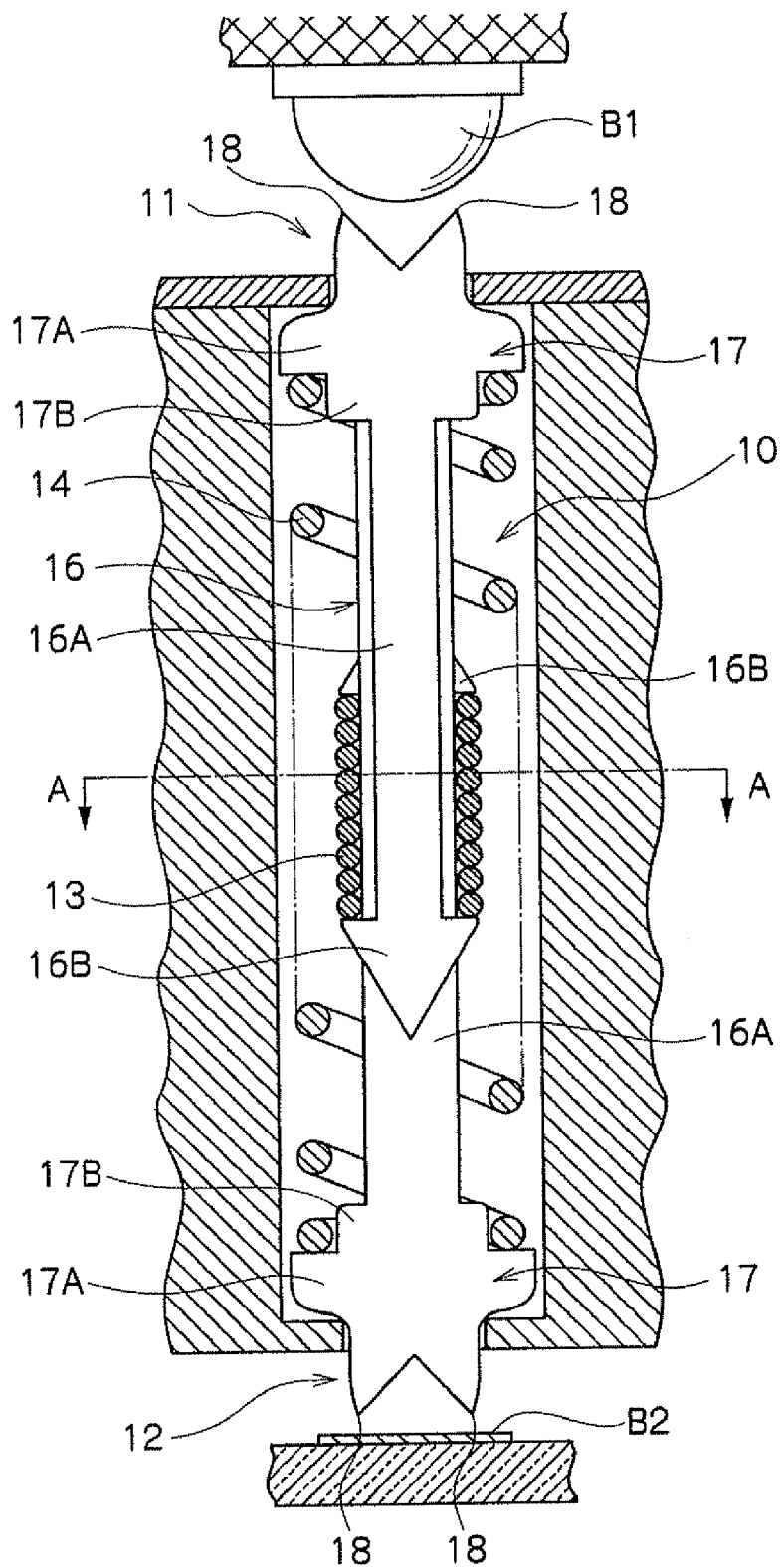
FIG. 1 is a partially exploded front view illustrating a contact according to a first embodiment of the present invention.
Figure 2:
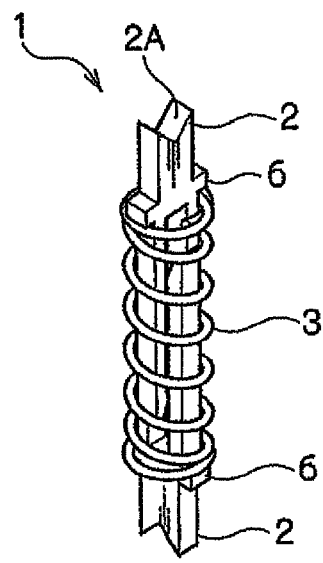
FIG. 2 is a perspective view illustrating a first prior-art example.
Figure 3:
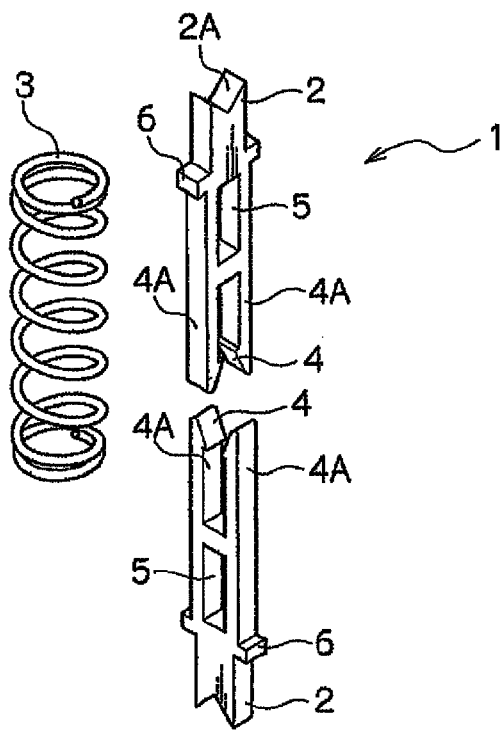
FIG. 3 is an exploded perspective view illustrating the first prior-art example.
Figure 4A:
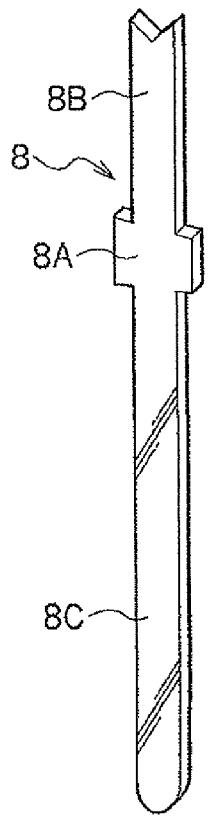
FIGS. 4A and 4B are exploded perspective views illustrating a second prior-art example.
Figure 4B:
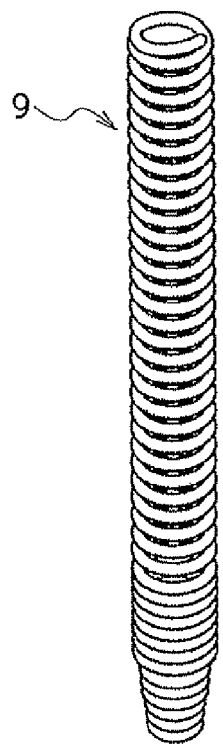
Figure 4C:
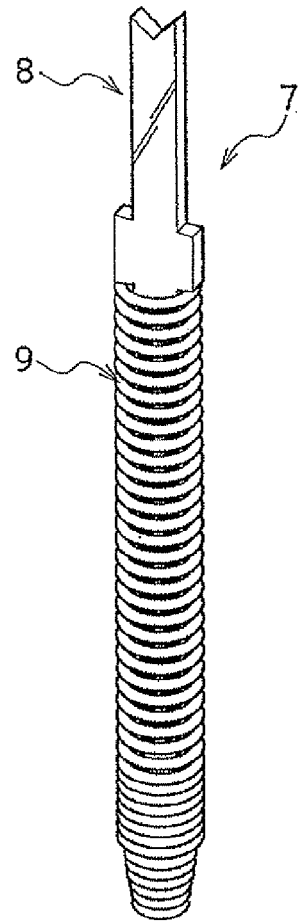
FIG. 4C is an assembled perspective view.
Figure 5:
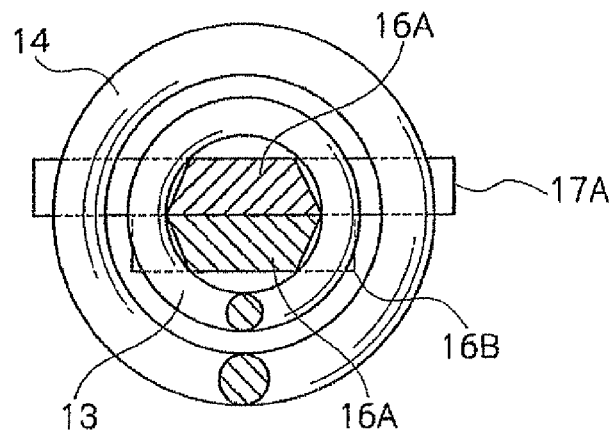
FIG. 5 is a sectional view on arrow of A-A line in FIG. 1.
Figure 6:
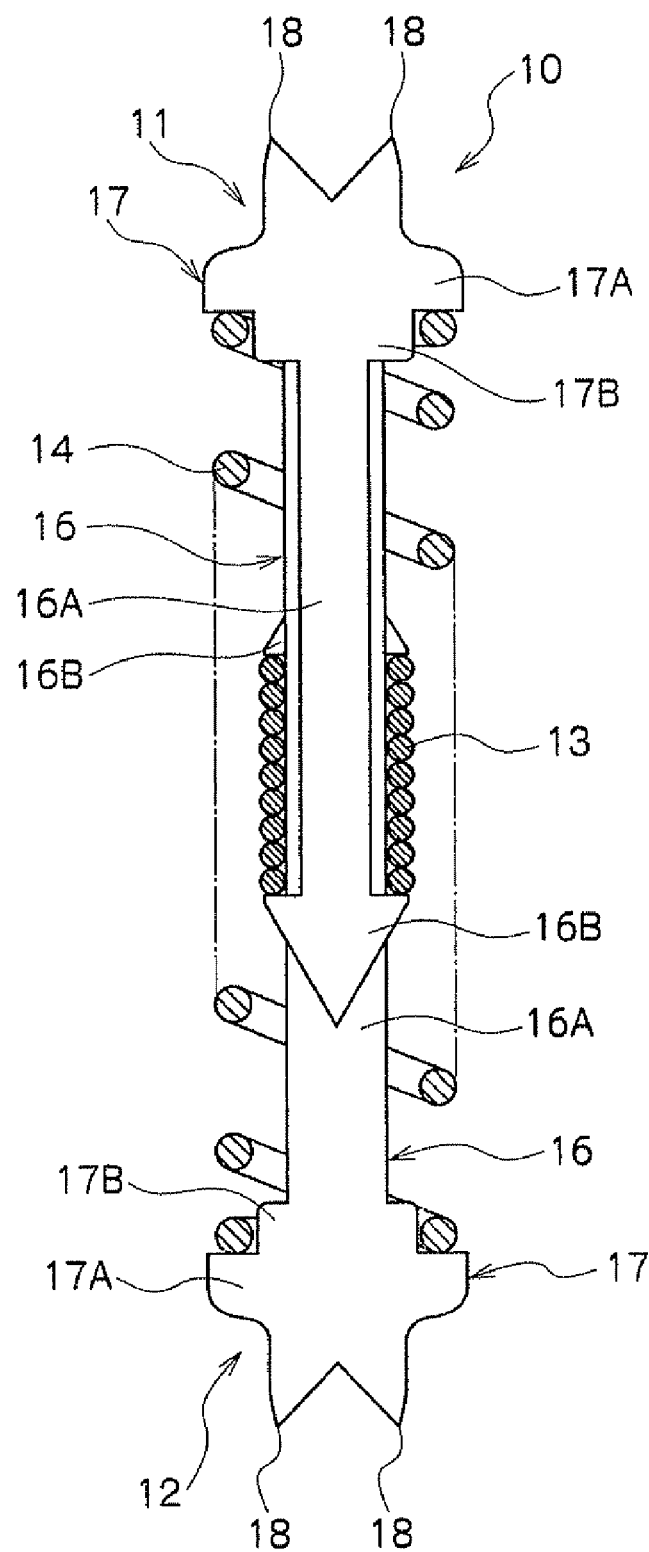
FIG. 6 is a front view illustrating a contact according to the first embodiment of the present invention.
Figure 7:
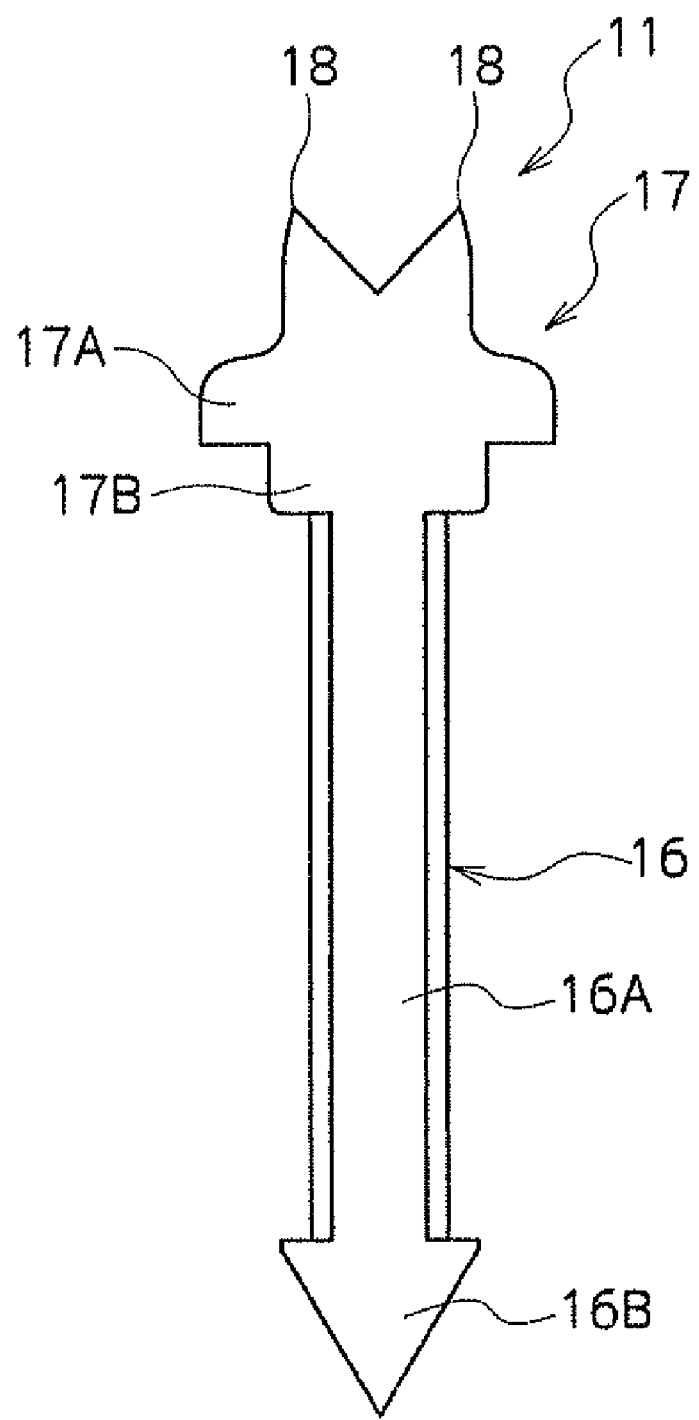
FIG. 7 is a front view illustrating a first plunger of the contact in FIG. 6.
Figure 8:
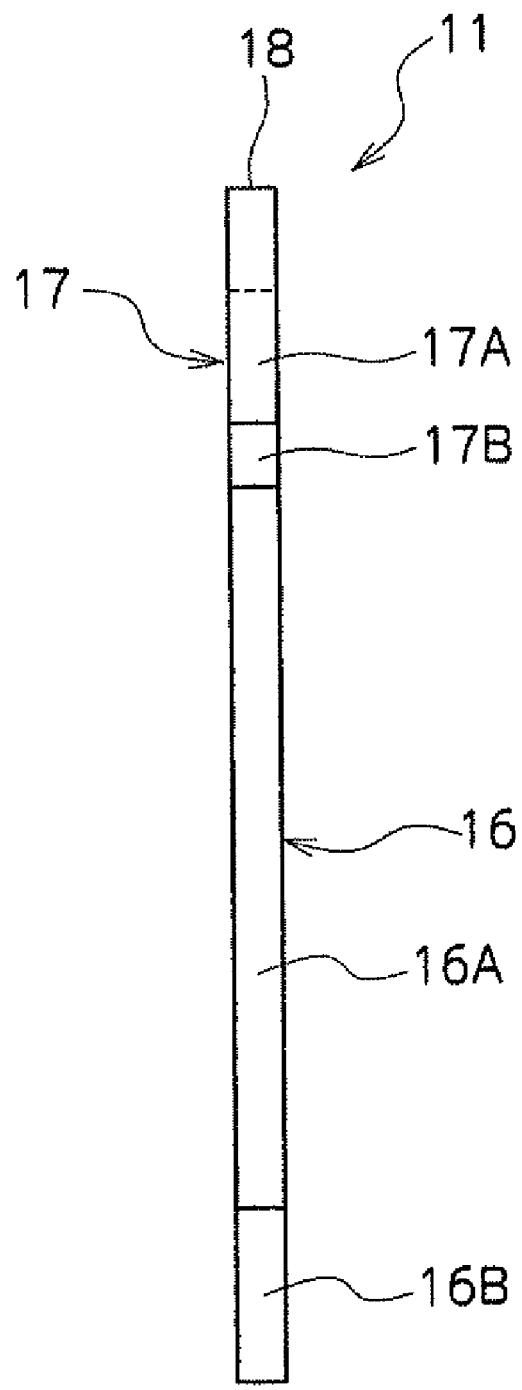
FIG. 8 is a side view illustrating the first plunger in FIG. 7.
Figure 9:
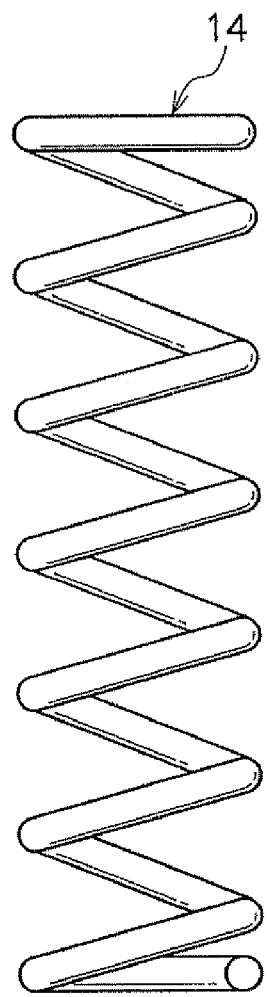
FIG. 9 is a front view illustrating a compression coil spring.
Figure 10:
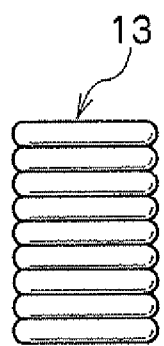
FIG. 10 is a front view illustrating a cylindrical support member.

A contact according to a first embodiment will be described below. FIG. 1 is a partially exploded front view illustrating the contact according to this embodiment, FIG. 5 is a sectional view on arrow of A-A line in FIG. 1, FIG. 6 is a front view illustrating the contact according to this embodiment, FIG. 7 is a front view illustrating a first plunger, FIG. 8 is a side view illustrating first and second plungers, FIG. 9 is a front view illustrating a compression coil spring, and FIG. 10 is a front view illustrating a cylindrical support member. Although FIG. 7 shows the first plunger, the second plunger has the same structure as that of the first plunger in FIG. 7. The contact of this embodiment electrically connects electric circuits and the like of opposing wiring substrates to each other by electrically conducting a member such as one of electrodes and the like and a member such as the other electrode or the like, similarly to the conventional contacts. This contact can be used as a spring probe, a pogo pin, and the like. Since a portion other than the contact is similar to conventional or known techniques, only the contact will be described below based on FIGS. 1 and 5 to 10.

A contact 10 of this embodiment is constituted by a first plunger 11, a second plunger 12, a cylindrical support member 13, and a compression coil spring 14.

The first plunger 11 is a plunger to be brought into contact with a member B1 such as a bump electrode or the like on one side. The second plunger 12 is a plunger to be brought into contact with a member B2 such as an electrode pad of a wiring substrate or the like on the other side in a state electrically connected to the first plunger 11 and for having the one member B1 and the other member B2 electrically conducted. The first plunger 11 and the second plunger 12 are constituted by plungers having the same shape. The plungers having the same shape are made as the first plunger 11 and the second plunger 12 by reversing the directions and overlapping connection portions 16, which will be described later. Each of the plungers 11 and 12 is formed by punching a plane material with a die. At this time, both sides of connecting rod portions 16A, which will be described later, are tapered. This taper is provided so that when the two connecting rod portions 16A are overlapped, their sections become hexagonal.

Each of the plungers 11 and 12 is constituted by the connection portion 16, a spring receiving portion 17, and a contact piece 18.

The connection portion 16 is constituted by the connecting rod portion 16A and a flange portion 16B. The connection portion 16 is a portion overlapped when the first plunger 11 and the second plunger 12 are connected to each other. The connecting rod portion 16A is formed so as to have a trapezoidal sectional shape as shown in FIG. 5 by tapering the both sides in punching work of a plane material. The portion is formed such that, in a state where the connection portions 16 of the plungers 11 and 12 are overlapped with each other, the sectional shapes become hexagonal, and six apexes are in contact with the inside of the cylindrical support member 13, which is their circumscribed circle.

The flange portion 16B is a portion for preventing drop off (removal from each other) of the plungers 11 and 12 from the cylindrical support member 13. That is, the flange portion 16B is formed by enlarging the connection portion 16 of the plungers 11 and 12 and is a portion for preventing the plungers 11 and 12 from dropping off the cylindrical support member 13 by being locked by both end portions of the cylindrical support member 13. Each of the flange portions 16B is formed with a dimension larger than the inner diameter of the cylindrical support member 13.

The spring receiving portion 17 is a portion for receiving the compression coil spring 14. The spring receiving portion 17 is formed with a distal end side of each of the plunger 11 and 12 having a dimension slightly larger than an outer diameter of the compression coil spring 14 and is brought into contact with the both end portions of the compression coil spring 14, respectively. As a result, by means of the compression coil spring 14 in contact with each of the spring receiving portion 17, each of the plungers 11 and 12 is urged in a direction to be separated from each other in a state in which the connection portions 16 are supported by the cylindrical support member 13 so as not to drop off.

The spring receiving portion 17 is constituted by a flange portion 17A and an enlarged portion 17B. The flange portion 17A is a portion with which the compression coil spring 14 is brought into contact so as to receive the compression coil spring 14. The portion is formed substantially equal to or slightly larger than the outer diameter of the compression coil spring 14 and supports the compression coil spring 14 by being brought into firm contact. When the both end portions of the compression coil spring 14 are brought into contact with the flange portion 17A of the plungers 11 and 12, the plungers 11 and 12 are electrically conducted through the compression coil spring 14. The enlarged portion 17B is a member for guiding the compression coil spring 14. The enlarged portion 17B is formed so as to extend from the flange portion 17A into the compression coil spring 14. The enlarged portion 17B is formed substantially equal to or slightly smaller than an inner diameter of the compression coil spring 14 and supports the compression coil spring 14 so as to prevent displacement thereof.

The contact piece 18 is a member to be brought into contact with each of the members B1 and B2 for electrically connecting these members. The contact piece 18 has its distal end constituted by a plurality of projections and enters into the members B1 and B2 to be electrically connected.

The cylindrical support member 13 is a member for slidably and elastically supporting the connection portion 16 of the first plunger 11 and the connection portion 16 of the second plunger 12 by overlapping them in an electrically connected state. The cylindrical support member 13 is specifically constituted by a conductive coil spring to be brought into elastic contact with the connection portions 16 of the plungers 11 and 12 and to slidably support them by elastically varying a diameter thereof. The coil spring is constituted by a tight spring in which a wire rod is wound plural times so as to be in close contact with each other and cylindrical. The inner diameter of the cylindrical support member 13 is set slightly smaller than a diameter of the circumscribed circle of the hexagon in which the connecting rod portions 16A are overlapped with each other. As a result, the cylindrical support member 13 can allow mutual sliding and prevents drop-off in a state in which the connecting rod portions 16A are in close contact with each other by elastically supporting the connecting rod portions 16A of the connection portions 16 with some tightening force and reliably maintains electrical connection. That is, even if the plungers 11 and 12 are displaced from each other due to expansion and contraction of the contact 10, the displacement is allowed and the plungers 11 and 12 are supported so that the electrical connection between the plungers 11 and 12 is reliably maintained. A path for this electrical connection is a portion where the connecting rod portions 16A are brought into close contact with each other in a wide area, a portion where each of the connecting rod portions 16A is pressed into contact with the cylindrical support member 13, and a portion where the flange portions 17A are in contact at the both end portions of the compression coil spring 14. Even if the plungers 11 and 12 are displaced from each other and a contact area between each of the connecting rod portions 16A is reduced, the pressure contact between each of the connecting rod portions 16A and the cylindrical support member 13 is reliably maintained, and the path for electrical connection is reliably maintained.

The compression coil spring 14 is a spring for urging each of the plungers 11 and 12 in a direction to be separated from each other. The compression coil spring 14 covers outer peripheries of the plungers 11 and 12 and the cylindrical support member 13 and is brought into contact with the flange portions 17A of the spring receiving portions 17, respectively, at the distal end sides of the plungers 11 and 12 for urging them in a direction to be separated from each other in a state where the connection portions 16 of the first plunger 11 and the second plunger 12 are supported by the cylindrical support member 13.

The contact 10 constituted as above is used as follows.

The contact 10 is attached to an inspecting device or the like as a spring probe or a pogo pin. In a state in which the contact piece 18 of the second plunger 12 is in contact with the electrode member B2 on the inspecting device side, if the contact piece 18 of the first plunger 11 is brought into contact with the member B1 such as a bump electrode of a circuit to be inspected, the contact 10 operates as follows.

When the contact piece 18 of the first plunger 11 is brought into contact with the member B1 and pressed onto the same, the first plunger 11 is pressed on the second plunger 12 side by that action. As a result, the connecting rod portion 16A of the first plunger 11 is displaced from the connecting rod portion 16A of the second plunger 12 in a state supported by the cylindrical support member 13, and the compression coil spring 14 received by the spring receiving portion 17 is compressed. Then, by means of a repulsion force of the compression coil spring 14, each of the contact pieces 18 is pressed onto and enters into each of the members B1 and B2.

At this time, since each of the connecting rod portions 16A of each of the plungers 11 and 12 is displaced in a state supported by the cylindrical support member 13, a state in which each of the connecting rod portions 16A is in contact with each other and electrically connected is reliably maintained. Moreover, even if each of the connecting rod portions 16A is displaced from each other, as shown in FIG. 5, the cylindrical support member 13 and each of the connecting rod portions 16A are brought into reliable contact through a large number of point contacts at positions between each apex of the hexagon and the inside of the cylindrical support member 13, and the state in which each of the connecting rod portions 16A and the cylindrical support member 13 are electrically connected is reliably maintained. Also, even if the connecting rod portion 16A on the upper side and the connecting rod portion 16A on the lower side are displaced from each other in a direction where shaft centers of the connecting rod portions 16A are displaced from each other, in the horizontal direction in FIG. 5, for example, or even if each of the connecting rod portions 16A is displaced in a direction to be separated from their contact faces, each of the connecting rod portions 16A and the cylindrical support member 13 are in contact through a large number of point contacts, and the electrically connected state is reliably maintained.

Moreover, since the spring receiving portions 17 of the plungers 11 and 12 are pressed into contact with both end portions of the compression coil spring 14, the electrically connected state of the plungers 11 and 12 is also reliably maintained by the compression coil spring 14.

As a result, each of the members B1 and B2 is reliably connected to each other by a path electrically connected through each of the connecting rod portions 16A whose electrically connected state is reliably maintained by the cylindrical support member 13 and a path electrically connected through the compression coil spring 14 brought into contact with the flange portion 17A of each of the spring receiving portions 17. That is, the members B1 and B2 are electrically connected by the contact 10 reliably. In this state, an electric signal or the like is transmitted between the members B1 and B2 through the contact 10.

When the contact piece 18 of the first plunger 11 is separated from the member B1 upon the end of an inspection or the like, the first plunger 11 and the second plunger 12 are urged by the compression coil spring 14 in a direction to be separated from each other. At this time, in each of the plungers 11 and 12, the flange portion 16B of the connecting rod portion 16A is locked by the both end portions of the cylindrical support member 13 and drop-off is prevented.

In the case of the subsequent use, similarly to the above, the contact piece 18 of the first plunger 11 is brought into contact with the member B1, the cylindrical support member 13 allows displacement of the connecting rod portions 16A and electrically connects them, and an inspection signal or the like is transmitted.

As mentioned above, since each of the connecting rod portions 16A of the first plunger 11 and the second plunger 12 are supported by the cylindrical support member 13 slidably and elastically in a state overlapped with each other and electrically connected to each other, electrical contact between each of the plungers 11 and 12 is improved. Moreover, combined with the compression coil spring 14 in contact with each of the spring receiving portions 17, electrical contact between each of the plungers 11 and 12 can be drastically improved.

Also, since each of the connecting rod portions 16A of the first plunger 11 and the second plunger 12 is supported by the cylindrical support member 13 slidably and elastically in a state overlapped with each other and electrically connected to each other, a self cleaning action of the contact portion works by use in which the connecting rod portions 16A are displaced from each other repeatedly and maintains electrical contact between each of the plungers 11 and 12 favorable, and durability of the contact 10 is improved. That is, even if each of the plungers 11 and 12 slides repeatedly or slides with the shaft core of each of the plungers 11 and 12 displaced, the cylindrical support member 13 elastically supports each of the plungers 11 and 12 and allows the displacement and maintains the electrical contact between the plungers 11 and 12 favorable. As a result, electrical contact is improved, and durability of the contact 10 is improved.

Also, since the cylindrical support member 13 is constituted by a tight spring and its diameter is elastically changed and elastically brought into contact with the connecting rod portion 16A of each of the plungers 11 and 12 and slidably supported, displacement of the connecting rod portion 16A is flexibly followed up, and an electrically connected state between each of the connecting rod portions 16A and between the cylindrical support member 13 and each of the connecting rod portions 16A can be reliably maintained.

Since the flange portion 16B in each of the connection portions of each of the plungers 11 and 12 is locked by the both end portions of the cylindrical support member 13, drop-off of the plungers 11 and 12 can be reliably prevented.

Since each of the connecting rod portions 16A is formed so that the sectional shape becomes a hexagon in an overlapped state, each apex of the hexagon and the cylindrical support member 13 are brought into contact with each other. Also, since the cylindrical support member 13 is made of a tight spring, each of the connecting rod portions 16A and the cylindrical support member 13 are in contact at a large number of points, and combined with contact between each of the connection portions 16, electrical contact is drastically improved.

Since the apparatus is constituted by the plungers 11 and 12 and the like in a simple structure, the number of components is small, by which costs can be reduced.

Also, since the plungers 11 and 12 are formed by punching a plate material with a die, its manufacture is easy, and a manufacturing cost of the contact can be reduced.

(B) Second Embodiment

Figure 11:
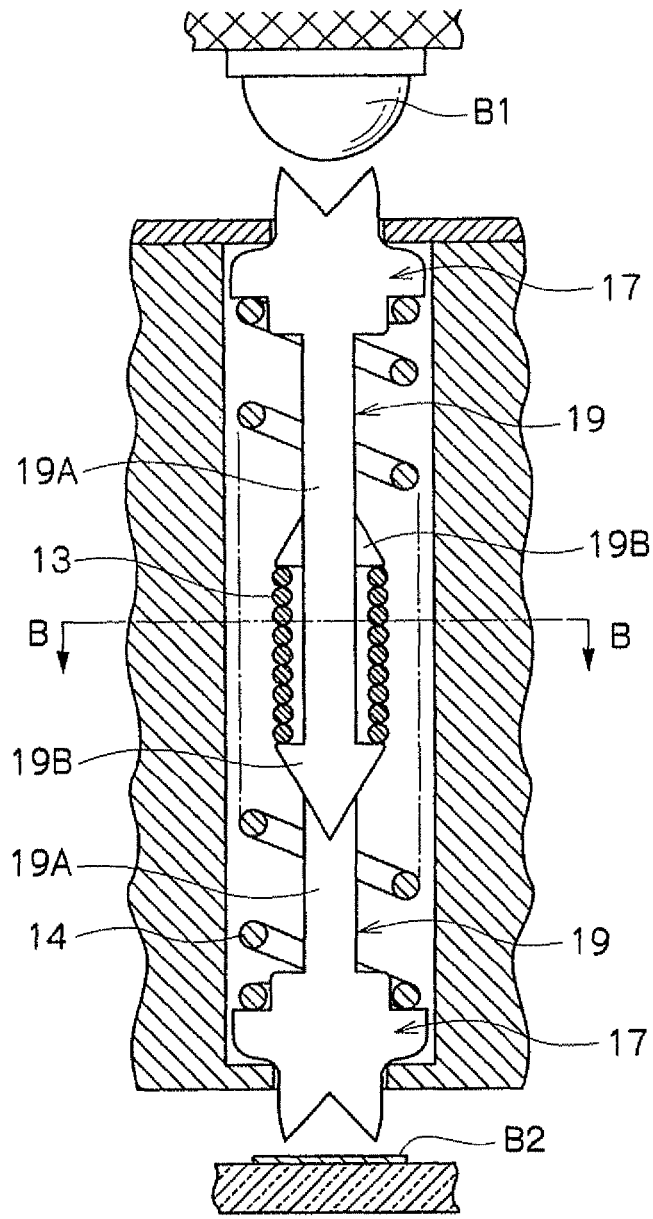
FIG. 11 is a partially exploded front view illustrating a contact according to a second embodiment of the present invention.
Figure 12:
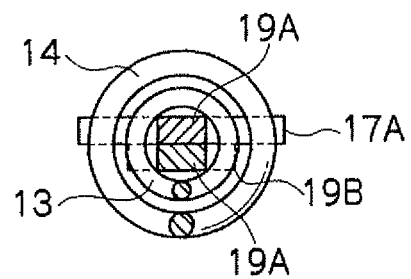
FIG. 12 is a sectional view on arrow of B-B line in FIG. 1.
Figure 13:
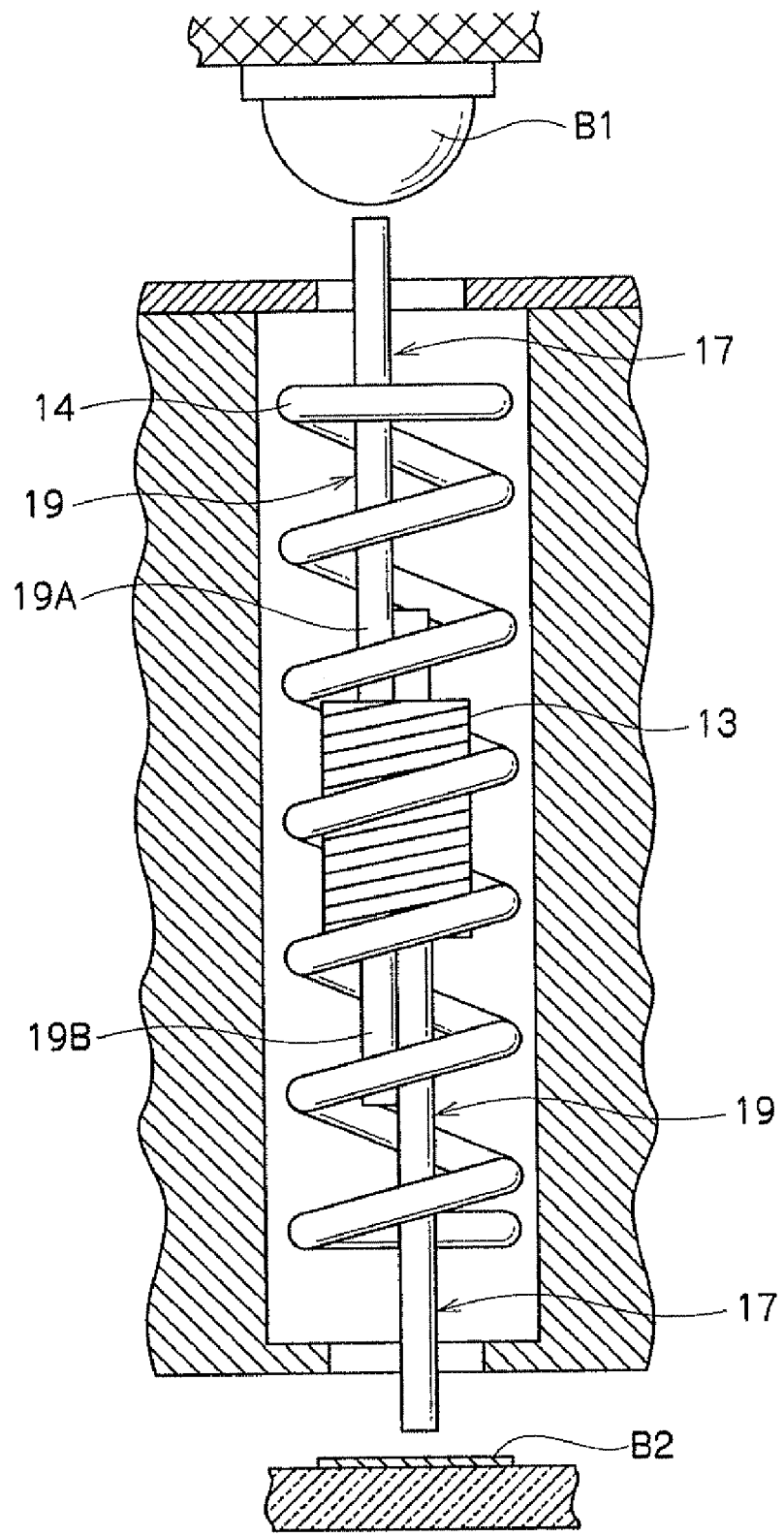
FIG. 13 is a partially exploded side view illustrating the contact according to the second embodiment of the present invention.
Figure 14:
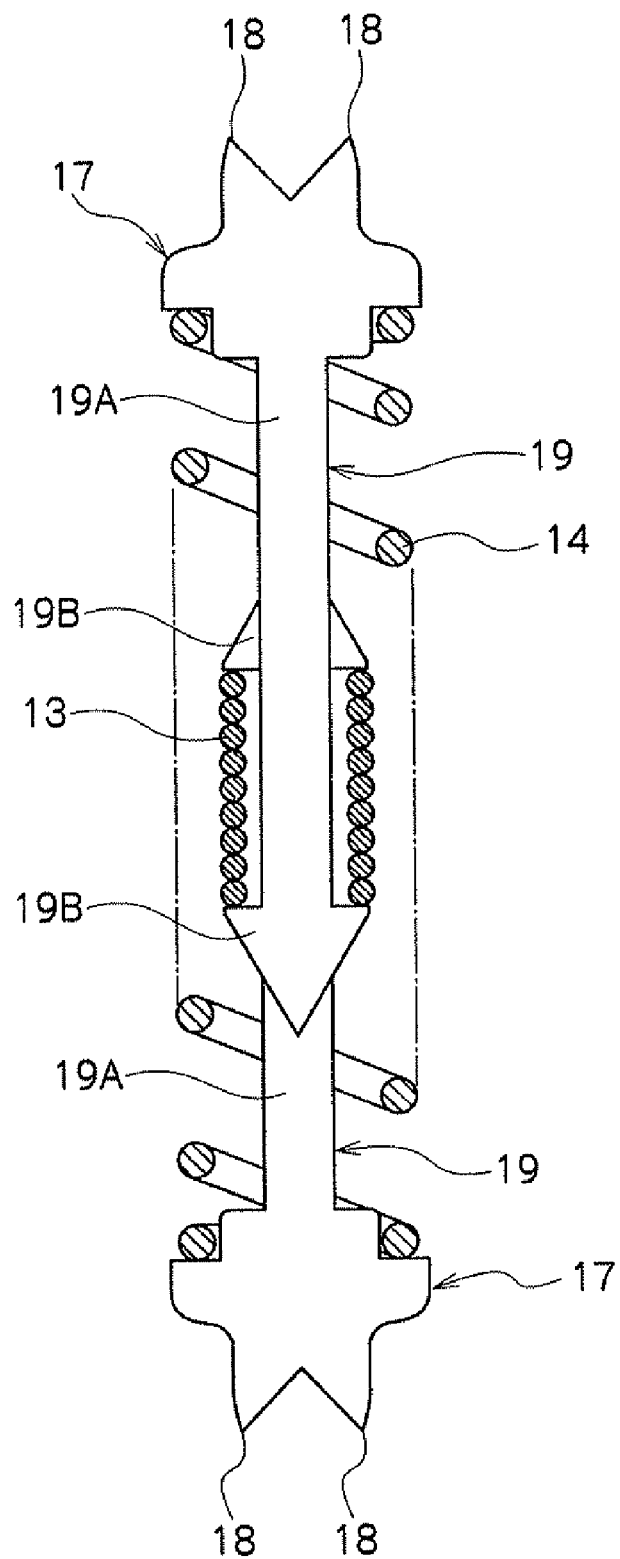
FIG. 14 is a front view illustrating the contact according to the second embodiment of the present invention.
Figure 15:
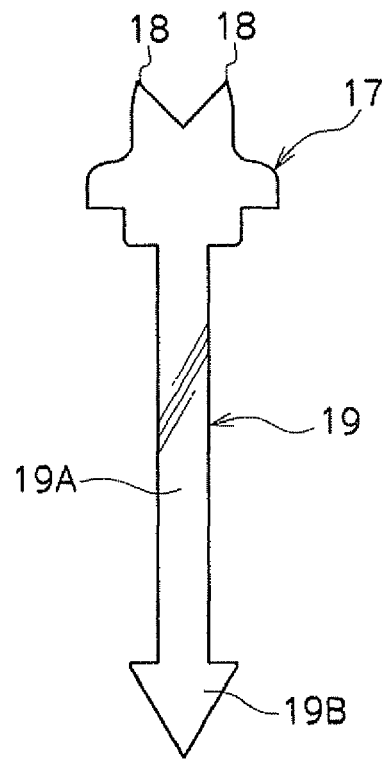
FIG. 15 is a front view illustrating a first plunger according to the second embodiment of the present invention.
Figure 16:
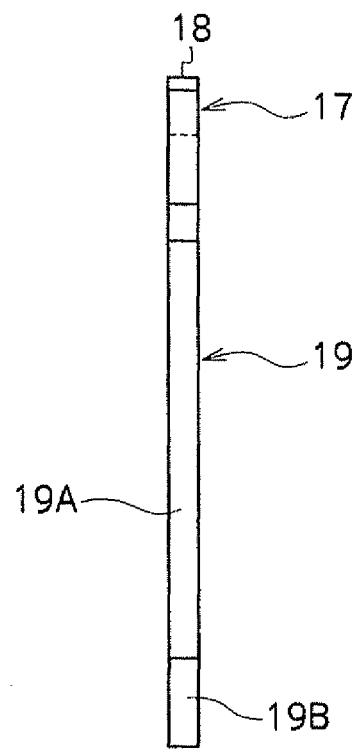
FIG. 16 is a side view illustrating the first plunger according to the second embodiment of the present invention.
Figure 17:
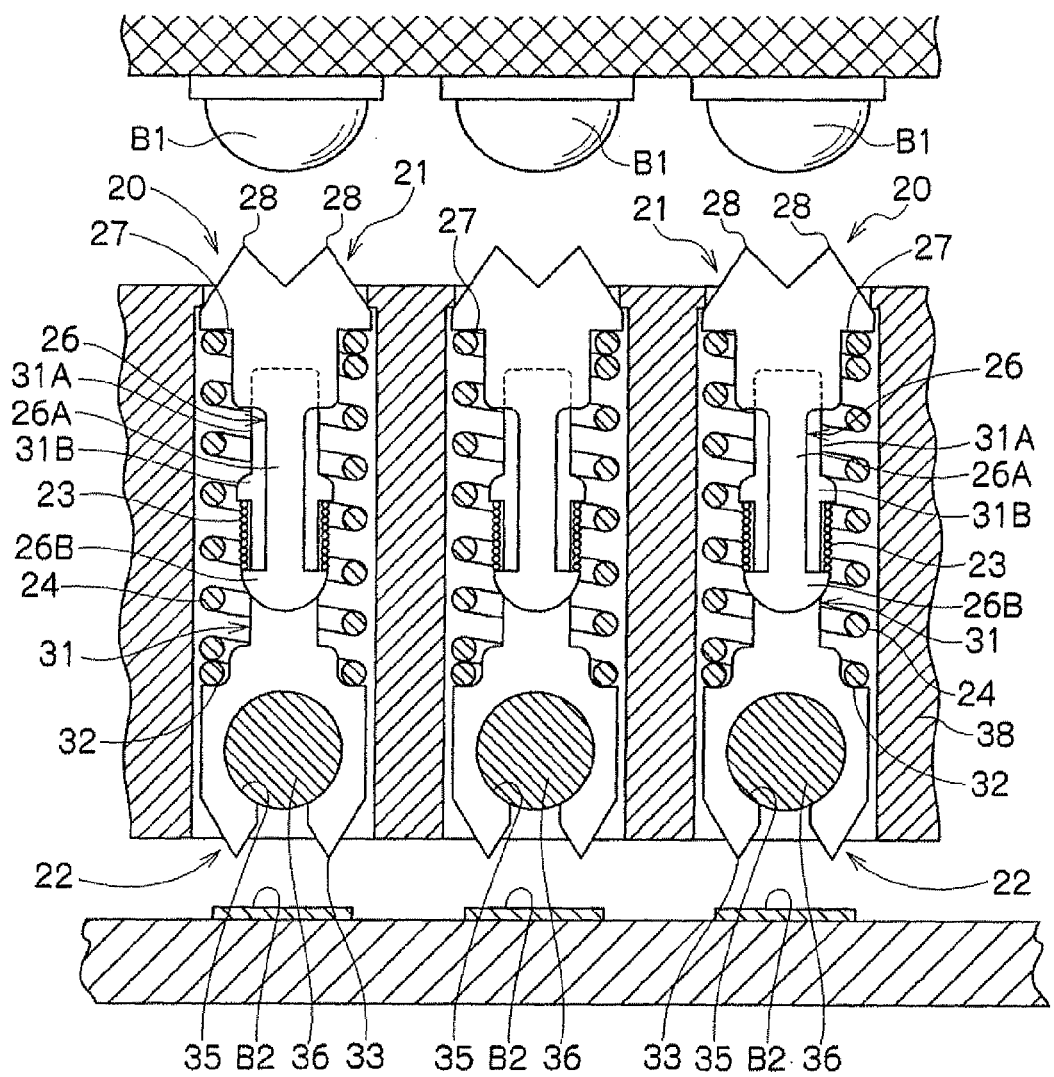
FIG. 17 is a partially exploded front view illustrating a contact according to a third embodiment of the present invention.
Figure 18:
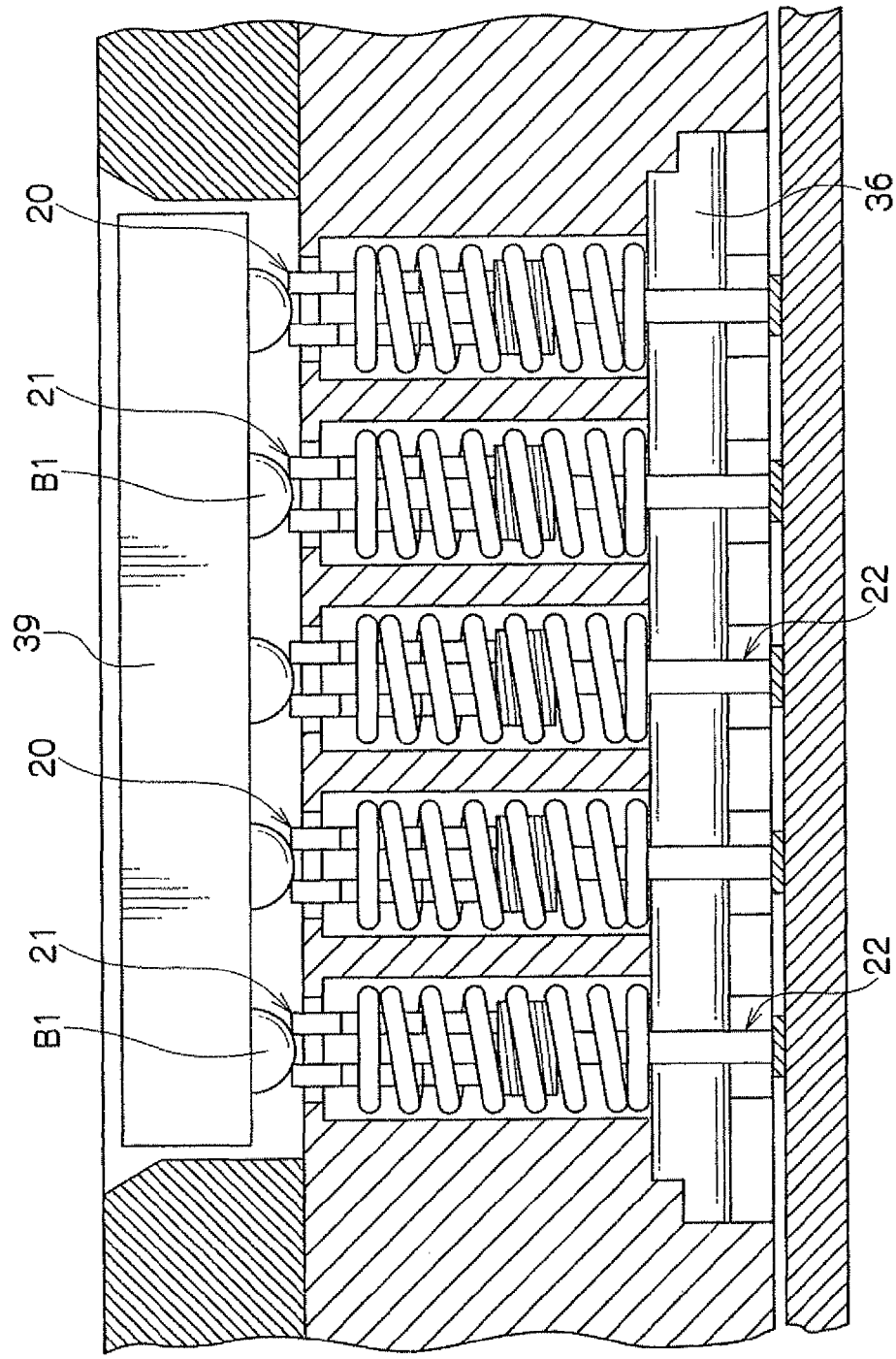
FIG. 18 is a partially exploded side view illustrating the contact according to the third embodiment of the present invention.
Figure 19:
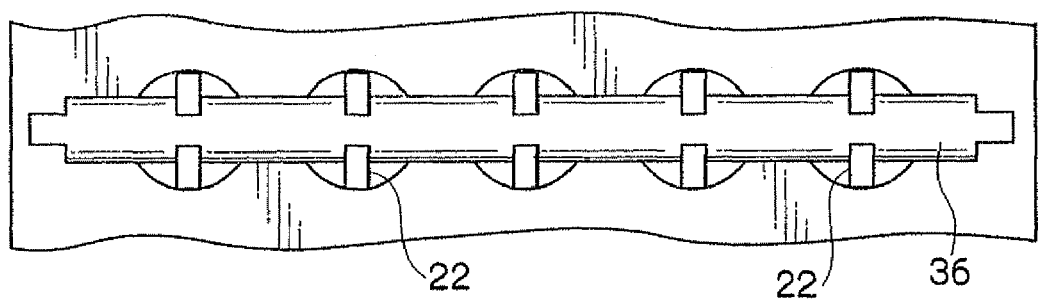
FIG. 19 is a bottom view of FIG. 18.
Figure 20:
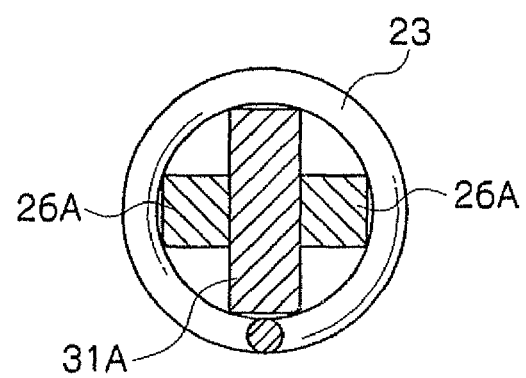
FIG. 20 is a sectional view of a portion in which a connection portion of the first plunger and a connection portion of a second plunger of the contact according to the third embodiment of the present invention are overlapped with each other.

Subsequently, a second embodiment of the present invention will be described. An entire configuration of the contact according to this embodiment is substantially the same as the contact of the above-mentioned first embodiment. Thus, the same reference numerals are given to the same members, and the description will be omitted. FIG. 11 is a partially exploded front view illustrating a contact according to this embodiment, FIG. 12 is a sectional view on arrow of B-B line in FIG. 1, FIG. 13 is a partially exploded side view illustrating the contact according to this embodiment, FIG. 14 is a front view illustrating the contact according to this embodiment, FIG. 15 is a front view illustrating a first plunger, and FIG. 16 is a side view illustrating the first plunger.

A characteristic of the contact in this embodiment is a connection portion 19. The connection portion 16 in the above-mentioned first embodiment has a trapezoidal section so as to become a hexagon when two portions are overlapped, but in this embodiment, a section of the connection portion 19 is a rectangular shape so as to become a square close to a regular tetragon when two portions are overlapped. That is, as shown in FIG. 12, a connecting rod portion 19A of the connection portion 19 is formed with a rectangular section. They are formed so that their sectional shape is a square close to a regular tetragon when the two connecting rod portions 19A are overlapped. By overlapping the two connecting rod portions 19A, a square shape is formed, and the inside of the cylindrical support member 13 is circumscribed. That is, the sectional shape of the connecting rod portion 19A is set so that the inside of the cylindrical support member 13 becomes a circumscribed circle with respect to the square sectional shape when the two connecting rod portions 19A are overlapped. Here, the sectional shape obtained by overlapping the two connecting rod portions 19A is, as shown in FIG. 12, substantially a square. The sectional shape obtained by overlapping the two connecting rod portions 19A may be a rectangular shape. In this case, each dimension is adjusted such that each apex of the rectangle is circumscribed by the inside of the cylindrical support member 13.

As a result, the same actions and effects as those of the above-mentioned first embodiment are exerted except that the sectional shape obtained by overlapping the two connecting rod portions 19A is circumscribed by the inside of the cylindrical support member 13 at four apexes.

(C) Third Embodiment

Subsequently, a third embodiment of the present invention will be described.

As for a contact of this embodiment, two contacts are provided so that one of a first plunger or a second plunger sandwiches the other from both sides. In this embodiment, two first plungers are provided, and the first plungers are configured so as to sandwich the second plunger from the both sides.

A contact 20 of this embodiment is, as shown in FIGS. 17 to 20, constituted by a first plunger 21, a second plunger 22, a cylindrical support member 23, and a compression coil spring 24.

The two first plungers 21 are provided so as to sandwich the second plunger 22 from the both sides. The two first plungers 21 are formed in the same shape. The first plunger is also formed by punching similarly to the first embodiment. Each of the first plungers 21 is independently supported by the cylindrical support member 23. The compression coil spring 24 is in contact with a spring receiving portion 27 of the first plunger 21 to incline its contact portion freely and allows independent sliding of the two first plungers 21. As a result, each of the first plungers 21 is individually displaced independently according to the shape of the member B1 so as to be reliably brought into contact. Each of the first plungers 21 is constituted by a connection portion 26, the spring receiving portion 27, and the contact piece 28.

The connection portion 26 is constituted by a connecting rod potion 26A and a flange portion 26B. The connecting rod portion 26A is a portion to be overlapped when the first plunger 21 and the second plunger 22 are connected to each other. The connecting rod portion 26A is formed in a strip shape narrower than a connection portion 31 of the second plunger 22, which will be described later. As a result, a width and a thickness of the connecting rod portion 26A is set so that, in a state where the two first plungers 21 and the single second plunger 22 are overlapped with each other, two corner portions located outside the connection portion 26 of each of the first plungers 21 (four corner portions in total) and four corner portions of the connection portion 31 of the second plunger 22 are located at apexes of an octagon (See FIG. 20). The eight apex positions forming this octagon are set so that an inner diameter of the cylindrical support member 23 becomes a circumscribed circle of the eight apexes. The octagon formed by the eight apex positions may be a regular octagon or any other octagons.

The flange portion 26B is a portion for preventing drop-off of the first plunger 21. Here, since it will be understood more easily if description is made at the same time as that of a flange portion 31B of the second plunger 22, which will be described later, the flange portion 31B of the second plunger 22 will be used as appropriate. The flange portion 31B is a portion for preventing the second plunger 22 from dropping off. Each of the flange portions 26B and 31B is formed with a dimension larger than the inner diameter of the cylindrical support member 23 in a state where the connection portions 26 and 31 of the plungers 21 and 22 are overlapped with each other and surrounded by the cylindrical support member.

The spring receiving portion 27 is a portion with which the compression coil spring 24 is brought into contact and receiving a pressure of the compression coil spring 24. The spring receiving portion 27 has a distal end side of the first plunger 21 formed with a dimension slightly larger than an outer diameter of the compression coil spring 24. The spring receiving portion 27 of the first plunger 21 and a spring receiving portion 32 of the second plunger 22, which will be described later, are brought into contact with the compression coil spring 24, which urges them in a direction to be separated from each other. At this time, the connection portions 26 and 31 of the plungers 21 and 22 are supported by the cylindrical support member 23 so as not to drop off.

The contact piece 28 is a member to be brought into contact with the member B1 for electrical connection. The contact piece 28 has its distal end constituted by a plurality of (two in this embodiment) projections. The contact piece 28 is provided on each of the two first plungers 21 and constitutes a large number of (four in this embodiment) contact points at one of the distal end portions of the contact 20. Moreover, combined with the fact that the two first plungers 21 can slide independently, the electrical contact between the first plunger 21 and the member B1 is improved.

The second plunger 22 is a plunger sandwiched by the two first plungers 21 and connected to each by the cylindrical support member 23. The second plunger 22 is formed by punching a plate material similarly to the first plunger 21. The second plunger 22 is constituted by the connection portion 31, the spring receiving portion 32, and a contact piece 33.

The connection portion 31 is constituted by a connecting rod portion 31A and a flange portion 31B. The connecting rod portion 31A is a portion where the first plunger 21 and the second plunger 22 are overlapped with each other when they are connected to each other. The connecting rod portion 31A is formed in a plate shape with a width larger than the connecting rod portion 26A of the first plunger 21. The sectional dimension of this connecting rod portion 31A is set such that the eight corner portions located outside in a state overlapped with the connecting rod portion 26A of the above-mentioned connection portion 26 are positioned at apexes of the octagon. That is, the sectional dimension of the connecting rod portion 31A is set such that the positions of the eight corner portions in contact with the circumscribed circle in the sectional shape in a state in which the connecting rod portion 26A of the first plunger 21 and the connecting rod portion 31A of the second plunger 22 are overlapped with each other are located at the apex positions of the octagon. The connecting rod portion 31A is formed by extending its distal end to the vicinity of the spring receiving portion 27 of the first plunger 21. As a result, a defect that the connecting rod portion 26A of the connection portion 26 in the first plunger 21 is short and narrow is compensated and a contact area is enlarged.

The flange portion 31B is a portion for preventing drop-off of the plungers 21 and 22 along with the flange portion 26B of the first plunger 21. A width dimension of the flange portion 31B is formed substantially equal to or slightly larger than the outer diameter of the cylindrical support member 23.

The spring receiving portion 32 is formed with a dimension larger than the outer diameter of the compression coil spring 24 and is brought into contact with an end portion of the compression coil spring 24. As a result, the compression coil spring 24 is brought into contact with the spring receiving portion 27 of the first plunger 21 and the spring receiving portion 32 of the second plunger 22, respectively, and urges the first plunger 21 and the second plunger 22 in a direction to be separated from each other. At the same time, the connection portions 26 and 31 of the plungers 21 and 22 are supported by the cylindrical support member 23 so that they will not drop off the other. As a result, since each of the plungers 21 and 22 is supported by the cylindrical support member 23 and urged by the compression coil spring 24, the contact 20 is compressed by a pressure from the outside and if the pressure from the outside ceases, the contact 20 returns to the original length.

A contact piece 33 is a member to be brought into contact with the member B2 for electrical connection. The contact piece 33 has its distal end constituted by a plurality of (two in this embodiment) projections.

An opening portion 35 is provided between the contact piece 33 and the spring receiving portion 32. This opening portion 35 is used to insert a support rod 36 to be positioned and supported. The opening portion 35 is formed by being notched in a circular shape between the two contact pieces 33. The support rod 36 is inserted through the opening portion 35, and the plurality of contacts 20 are integrally held. The support rod 36 is a member for integrally holding the plurality of contacts 20 by being inserted through each of the openings 35 of the plurality of contacts 20. The support rod 36 is formed in a shape of a circular rod. The support rod 36 is formed by an insulating elastic member such as silicon rubber and mounted on a bottom portion of a housing 38. As a result, the plurality of contacts 20 inserted into the housing 38, respectively, are supported in a state insulated to each other.

The cylindrical support member 23 is a member for slidably and elastically supporting the connection portion 31 of the second plunger 22 and the connection portions 26 of the two first plungers 21 located on both faces of the connection portion 31 of the second plunger 22 in an overlapped and electrically connected state. This cylindrical support member 23 is specifically constituted by a coil spring, similarly to the first embodiment, which varies its diameter elastically and is elastically brought into contact with the connection portions 26 and 31 of the plungers 21 and 22 so as to slidably support them. The coil spring is constituted by a tight spring. An inner diameter of the cylindrical support member 23 is, similarly to the first embodiment, set such that a lateral sectional area is slightly smaller than a diameter of a circumscribed circle circumscribed by each corner to become an apex position of the octagon in a state in which the connecting rod portions 26A and 31A are overlapped with each other. As a result, the cylindrical support member 23 allows mutual sliding of the connecting rod portions 26A and 31A in a close contact state, prevents drop-off, and reliably maintains electric connection by elastically supporting the connecting rod portions 26A and 31A with some tightening force.

The compression coil spring 24 is a spring for urging the plungers 21 and 22 in a direction to be separated from each other similarly to the first embodiment.

The contact 20 constituted as above is used as follows.

Since an entire operation of the contact 20 of this embodiment is similar to the contact 10 of the first embodiment, a difference from the first embodiment will be mainly described. The contact 20 is supported by the support rod 36. Specifically, by inserting the support rod 36 through the opening portion 35 in the contact 20, the plurality of contacts 20 are integrally supported and housed in the housing 38. In this state, the member B1 such as a bump electrode of a specimen 39 is located on an upper side of the contact 20, and the member B2 such as an electrode pad of a wiring substrate on a tester side is located on a lower side of the contact 20.

If each of the members B1 and B2 is brought into contact with each of the contacts 20 and pressed thereon, the contacts 20 operate as follows.

If the contact piece 28 of the first plunger 21 is brought into contact with the member B1 and pressed thereon, the first plunger 21 is pushed toward the second plunger 22 side by the action. As a result, the connecting rod portion 26A of the first plunger 21 is displaced from the connecting rod portion 31A of the second plunger 22 in a state supported by the cylindrical support member 23, and the compression coil spring 24 received by the spring receiving portion 27 is compressed. By means of a repulsion force of the compression coil spring 24, each of the contact pieces 28 and 33 is pressed onto and bitten into each of the members B1 and B2.

As a result, similarly to the first embodiment, an electrically connected state between each of the connecting rod portions 26A and 31A and the compression coil spring 24 is reliably maintained.

Moreover, in this embodiment, since the two first plungers 21 slide independently, even if heights of contact portions of the two first plungers 21 are different such as in a case in which the member B1 is deformed, the two first plungers 21 follow the shape with displacement and touch with the respective contact pieces 28. Here, the member B1 is in a semispherical shape, but even if the member B1 is in a distorted spherical shape or any other shapes and even if the contact positions of the two first plungers 21 are displaced, the shape is followed up with displacement and touched by the respective contact pieces 28.

As a result, the members B1 and B2 are electrically connected by the contact 20 reliably. In this state, an electric signal or the like is transmitted between the members B1 and B2 through the contact 20.

When the contact piece 28 of the first plunger 21 is separated from the member B1 upon the end of an inspection or the like, each of the plungers 21 and 22 is supported at the flange portions 26B and 31B by the both end portions of the cylindrical support member 23, and drop-off is prevented. In the subsequent use, too, similarly to the above, the contact pieces 28 of the two first plungers 21 are brought into contact with the member B1, the cylindrical support member 23 allows the displacement of the connecting rod portions 26A and 31A and electrically connects them, and an inspection signal or the like is transmitted.

As mentioned above, the same effect as the first embodiment is exerted. Moreover, in this embodiment, since the first plunger 21 and the second plunger 22 are formed simply by punching a plate material, its manufacture is easy and inexpensive, and a manufacturing cost of the contact can be reduced.

Also, in this embodiment, since independent sliding of the two first plungers 21 is allowed, each of the first plungers 21 is individually displaced independently according to the shape of the member B1 and is reliably brought into contact.

As mentioned above, by means of contact of two first plungers 21 with the member B1 and individual and independent displacement and reliable contact of each of the first plungers 21 according to the shape of the member B1, reliable contact at a plurality of points is ensured regardless of a situation of deformation, damage and the like of the member B1, and electrical contact is drastically improved.

Fourth Embodiment

Figure 21:
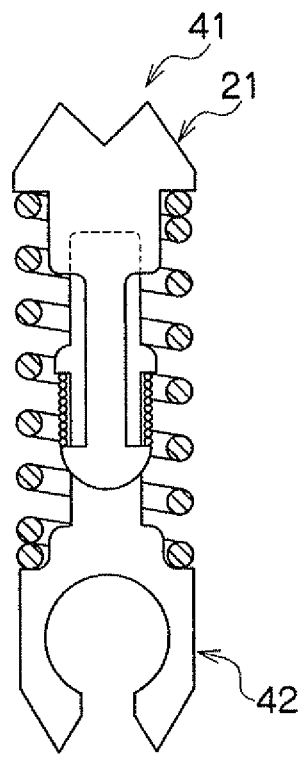
FIG. 21 is a partially exploded front view illustrating a contact according to a fourth embodiment of the present invention.
Figure 22:
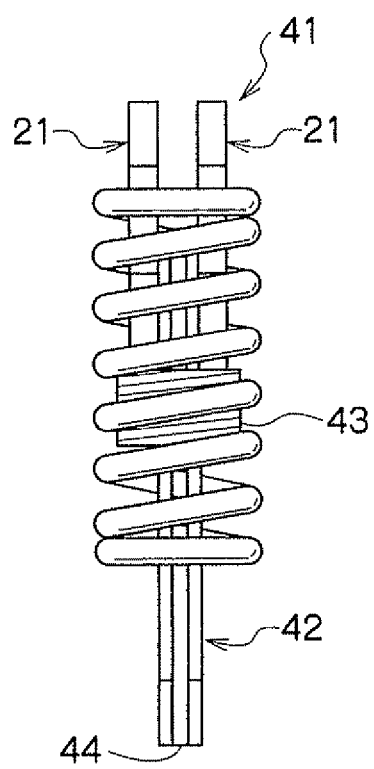
FIG. 22 is a partially exploded side view illustrating the contact according to the fourth embodiment of the present invention.

Subsequently, a contact according to the fourth embodiment of the present invention will be described. The contact of this embodiment is a Kelvin contact constituted by providing two second plungers on the contact 20 of the third embodiment. An entire configuration of the contact of this embodiment is substantially similar to the contact 20 of the third embodiment. That is, a contact 41 of this embodiment is, as shown in FIGS. 21 and 22, different in a second plunger 42 and a cylindrical support member 43. The other members are the same. Therefore, the same reference numerals are given to the same members, and the description will be omitted.

In the contact 41 of this embodiment, two second plungers 42 are provided similarly to the first plungers 21. The two second plungers 42 have the same shape, and an insulator 44 is provided between each of the second plungers 42. The two second plungers 42 are integrally connected while sandwiching the insulator 44. The insulator 44 may be a plate-shaped member that can insulate between the two second plungers 42. By means of the insulator 44, the two second plungers 42 and the two first plungers 21 brought into contact with each of the second plungers 42 are insulated, respectively.

The cylindrical support member 43 is a tight coil spring for integrally surrounding and supporting the two first plungers 21, the two second plungers 42, and the insulator 44 in an overlapped state. The entire configuration of the cylindrical support member 43 is similar to that of the cylindrical support member 23 in the third embodiment, but in this embodiment, the cylindrical support member 43 is constituted by an insulating material. That is, while the cylindrical support member 23 of the third embodiment is constituted by a conductive material, the cylindrical support member 43 of this embodiment is constituted by an insulating material. Since it is only necessary for the cylindrical support member 43 to have insulation, a spring material made of metal may be applied with insulating coating. The compression coil spring 24 is also constituted by an insulating material or applied with insulating coating.

As a result, one of the first plungers 21 and one of the second plungers 42 are electrically connected, while the other of the first plungers 21 and the other of the second plungers 42 are electrically connected, and a signal is transmitted through two systems.

The contact constituted as above acts similarly to the third embodiment. Since the two second plungers 42 are integrally joined while sandwiching the insulator 44, the plunger can be considered to be substantially the same member as the second plunger 22 in the third embodiment except that the thicknesses are slightly different and acts similarly to the third embodiment.

As a result, similarly to the third embodiment, reliable contact at a plurality of points can be ensured regardless of a situation such as deformation, damage and the like of the member B1, and electrical contact is drastically improved. In this state, Kelvin contact can be reliably performed.

(E) Fifth Embodiment

Figure 23:
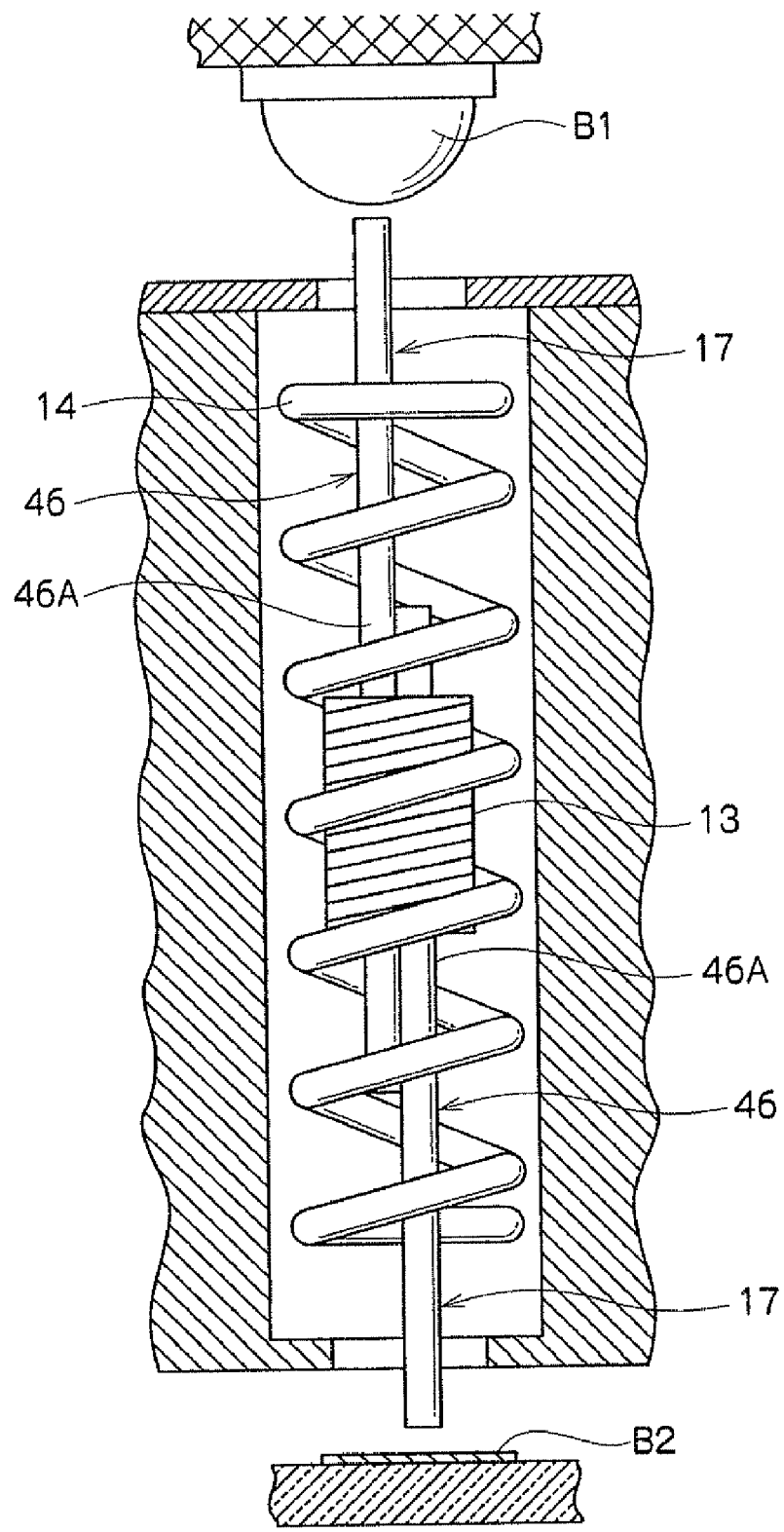
FIG. 23 is a partially exploded side view illustrating a contact according to a fifth embodiment of the present invention.
Figure 24:
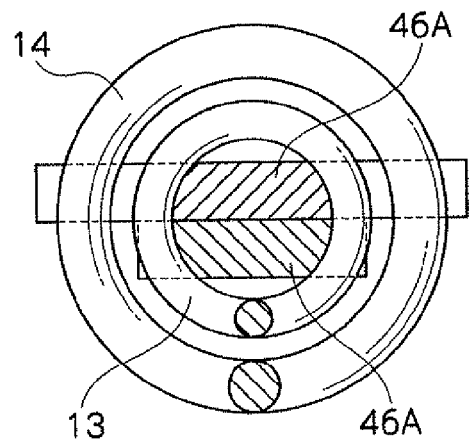
FIG. 24 is a planar sectional view illustrating the contact according to the fifth embodiment of the present invention.

Subsequently, a contact according to the fifth embodiment will be described. FIG. 23 is a partially exploded side view illustrating the contact according to this embodiment, and FIG. 24 is a planar sectional view of FIG. 23.

The contact of this embodiment is obtained by improving the sectional shape of the connecting rod portion 16A of the connection portion 16 in the first embodiment. Since the contact of this embodiment is similar to the first embodiment except the connecting rod portion 46A of the connection portion 46, the same reference numerals are given to the same members, and the description will be omitted.

In this embodiment, the connecting rod portion 46A of the connection portion 46 is formed in an arc shape along the inner diameter of the cylindrical support member 13.

The connecting rod portion 46A of the connection portion 46 is formed in a plate shape and both sides thereof are formed in an arc shape along the inner diameter of the cylindrical support member 13. The both sides of the connecting rod portion 16A in the first embodiment are tapered, but an arc shape is used instead of taper in this embodiment.

As a result, the two connecting rod portions 46A of the connection portions 46 overlapped with each other are brought into contact with the inner diameter of the cylindrical support member 13 through a long line.

If the section is a hexagon in a state in which the two connecting rod portions 16A are overlapped with each other as in the first embodiment, they are in contact with the inner diameter of the cylindrical support member 13 at six points, but in this embodiment, they are in contact through a long line.

As a result, the same actions and effects as those of the first embodiment are exerted, and conductivity between the connecting rod portion 16A and the cylindrical support member 13 can be further improved.

(F) Sixth Embodiment

Figure 25:
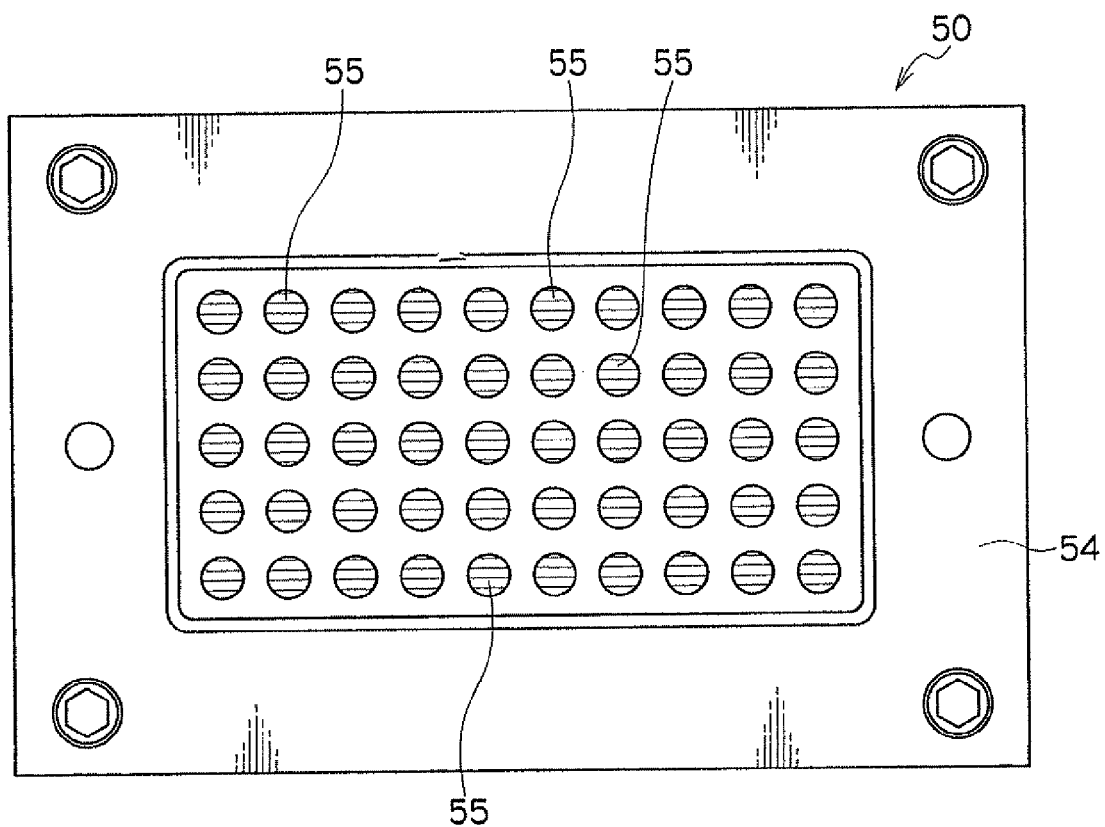
FIG. 25 is a plan view illustrating an electrical connecting apparatus according to a sixth embodiment of the present invention.
Figure 26:
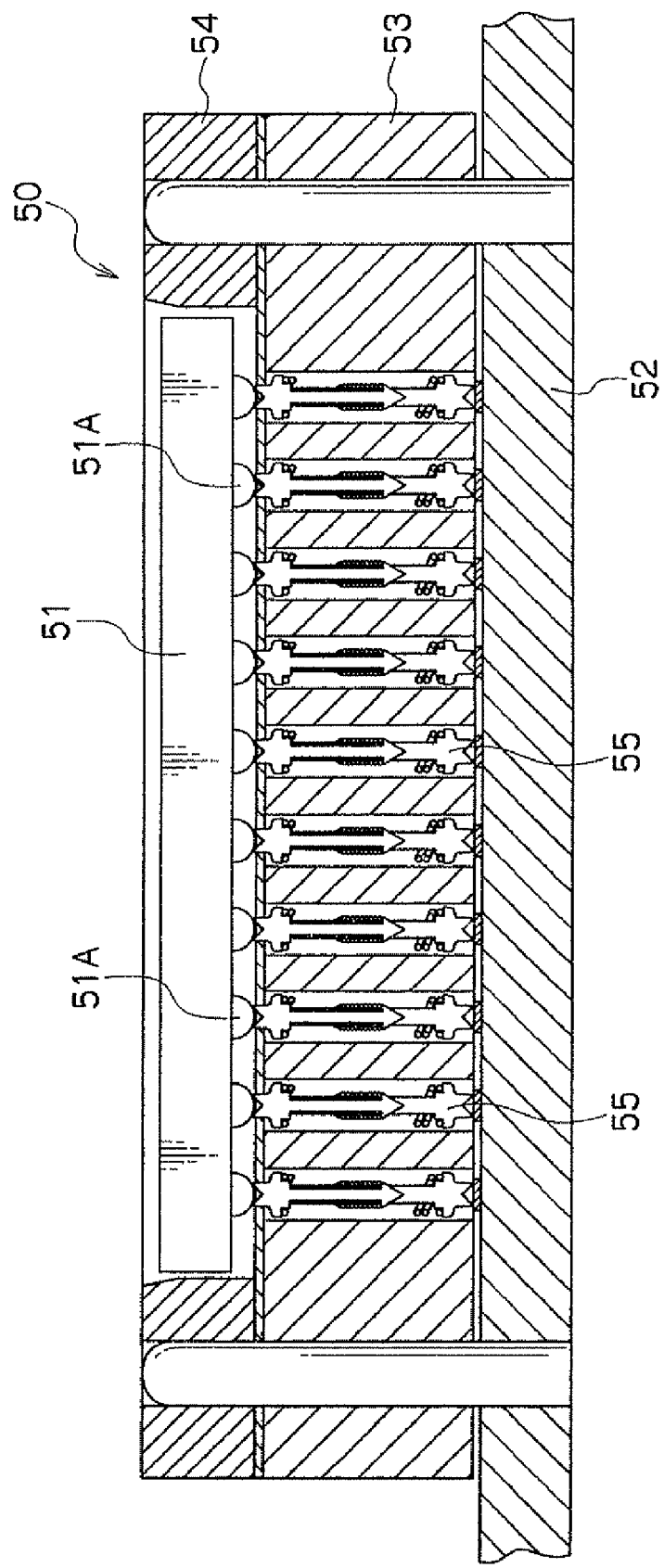
FIG. 26 is a sectional view illustrating the electrical connecting apparatus according to the sixth embodiment of the present invention.

Subsequently, an example of an electrical connecting apparatus using the contact of each of the above embodiments will be described. FIG. 25 is a plan view illustrating the electrical connecting apparatus, and FIG. 26 is a sectional view illustrating the electrical connecting apparatus.

An electrical connecting apparatus 50 of this embodiment is used in a current test of a semiconductor device such as an integrated circuit as a specimen. A specimen 51 is formed in a plate shape, and a plurality of bump electrodes 51A are provided on one of its faces in a matrix state. The bump electrode 51A may be provided in a single row, plural rows or other arrangements.

The electrical connecting apparatus 50 is provided with a substrate 52, a housing 53 overlapped on the substrate 52, a frame 54 overlapped on the housing 53, and a plurality of contacts 55 arranged in the housing 53. As the contact 55, the contact of each of the above embodiments is used.

As a result, the bump electrode 51A of the specimen 51 is brought into contact with the contact 55 and acts similarly to each of the above embodiments and exerts the same effect.

Also, electrical connecting apparatuses in other configurations can be used as long as it is an electrical connecting apparatus that can use the contact of each of the above embodiments in a mode similar to the contact 55 of this embodiment.

(G) Variations

In the first embodiment, it is set such that the plungers 11 and 12 have a hexagonal sectional shape when base end sides thereof are overlapped with each other, but the sectional shape may be other polygons such as an octagon or a regular polygon. Also, it may be formed in a circular shape. Particularly, if the sectional shape is formed in a circular shape, since they are in contact with the cylindrical support member 13 through a large number of lines, and electrical contact between the cylindrical support member 13 and the base end sides of the plungers 11 and 12 is further improved.

In the second embodiment, the two first plungers 21 are provided, and the second plunger 22 is sandwiched by the first plungers 21 from both sides, but it may be a reversed configuration. It may be so configured that the two second plungers 22 are provided according to a use mode in which the electric contact on the second plunger 22 side should be improved or the like, and the first plunger 21 is sandwiched by the second plungers 22 from the both sides.

The contact of the present invention can be used in an apparatus in general to be touched by an electrode provided in a wiring substrate, a semiconductor integrated circuit and the like.

The electrical connecting apparatus can be applied to all the apparatuses that can use the contact of the present invention.

The invention claimed is:

1. A contact comprising:
   a first plunger in contact with one of members;
   a second plunger in contact with the other member in a state electrically connected to the first plunger so as to have the one member and the other member electrically conducted in collaboration with said first plunger;
   a cylindrical support member for slidably and elastically supporting said first plunger and said second plunger by overlapping and electrically connecting a connection portion of said first plunger and a connection portion of said second plunger with each other; and
   a compression coil spring covering outer peripheries of said first plunger and said second plunger in a state in which each of the connection portions thereof is supported by the cylindrical support member and brought into contact with a spring receiving portion of each of the plungers so as to urge the plungers in a direction to be separated from each other.

2. The contact according to claim 1, wherein
   said cylindrical support member is constituted by a coil spring brought into elastic contact with the connection portion of each of said plungers and slidably supporting the plungers.

3. The contact according to claim 2, wherein
   said coil spring is constituted by a tight spring in which a wire rod wound plural times is in close contact with each other; and
   each of said plungers is provided with a locking portion for preventing drop-off of each plunger at the connection portion thereof.

4. The contact according to claim 1, wherein
   each of the connection portions of said first plunger and said second plunger has a sectional shape formed as a polygon or a circle in a state overlapped with each other.

5. The contact according to claim 1, wherein
   one of said first plunger or said second plunger is provided in two pieces so as to sandwich the other from both sides.

6. The contact according to claim 5, wherein
   said first plungers or said second plungers provided in two pieces are independently and slidably supported by said cylindrical support member and the compression coil spring.

7. The contact according to claim 1, wherein
   one of said first plunger or said second plunger is provided in two pieces sandwiching the other from both sides and the other is provided in two pieces sandwiching an insulator so as to constitute Kelvin contact.

8. An electrical connecting apparatus for conducting a test in contact with an electrode of a specimen, comprising
   a contact disposed at a position corresponding to each of electrodes of said specimen, brought into contact with and conducting each of the electrodes, wherein
   the contact according to claim 1 is used as the contact.

* * * * *